United States Patent
Iwaida et al.

(10) Patent No.: US 8,008,761 B2
(45) Date of Patent: Aug. 30, 2011

(54) OPTICAL SEMICONDUCTOR APPARATUS

(75) Inventors: Koichi Iwaida, Tokyo (JP); Michiyo Kubo, Tokyo (JP)

(73) Assignee: FiBest Limited, Tokyo (JP)

( * ) Notice: Subject to any disclaimer, the term of this patent is extended or adjusted under 35 U.S.C. 154(b) by 126 days.

(21) Appl. No.: 12/462,125

(22) Filed: Jul. 29, 2009

(65) Prior Publication Data

US 2010/0025843 A1    Feb. 4, 2010

(30) Foreign Application Priority Data

Jul. 30, 2008    (JP) ................................. 2008-196184

(51) Int. Cl.
    *H01L 23/02*      (2006.01)
(52) U.S. Cl. .......... 257/678; 257/81; 257/684; 257/690; 257/693; 257/E23.184
(58) Field of Classification Search .......... 257/678–733, 257/787–796, E23.001–E23.194, E21.499–E21.519, 257/81; 438/15, 26, 51, 64, 106, 124–127
See application file for complete search history.

(56) References Cited

U.S. PATENT DOCUMENTS

| 4,295,152 | A | * | 10/1981 | Khoe et al. | 257/680 |
| 5,252,856 | A | * | 10/1993 | Murai | 257/678 |
| 5,691,536 | A | * | 11/1997 | Shimoyama et al. | 438/7 |
| 5,814,871 | A | * | 9/1998 | Furukawa et al. | 257/433 |
| 6,900,512 | B2 | * | 5/2005 | Kohmoto et al. | 257/435 |
| 2004/0264980 | A1 | | 12/2004 | Baek et al. | |

FOREIGN PATENT DOCUMENTS

| JP | 9-232500 A | 9/1997 |
| JP | 10-4510 A | 1/1998 |

* cited by examiner

*Primary Examiner* — Jasmine J Clark
(74) *Attorney, Agent, or Firm* — Carrier Blackman & Associates, P.C.; Joseph P. Carrier; William D. Blackman

(57) ABSTRACT

An optical semiconductor apparatus composed of a cap and a base, includes: a metal package including a plurality of openings penetrating through the base from outside to inside, a lead with its end portion protruding to the inside of the base and an insulator covering a side surface of the lead being inserted into each of the openings, and the lead being insulated from the base; an insulating film with its backside bonded to the inside of the base; and a semiconductor component placed on the base or on the insulating film. The insulating film covers the opening up to the vicinity of the side surface of the lead.

9 Claims, 9 Drawing Sheets

OPTICAL SEMICONDUCTOR APPARATUS

CROSS-REFERENCE TO RELATED APPLICATIONS

This application is based upon and claims the benefit of priority from the prior Japanese Patent Application No. 2008196184, filed on Jul. 30, 2008; the entire contents of which are incorporated herein by reference.

BACKGROUND OF THE INVENTION

1. Field of the Invention

This invention relates to an optical semiconductor apparatus with an optical semiconductor chip built in a metal package.

2. Background Art

In a typical configuration of an optical semiconductor apparatus used for optical transmission/reception, an optical semiconductor chip, such as a semiconductor laser, light emitting diode, and photodiode, is placed in a metal package, and a lead for externally extracting an electrical signal is connected to the optical semiconductor chip by a metal wire in the metal package. As a metal package for an optical semiconductor apparatus, a TO (transistor outline) package is widely used, which is easily connected to an optical fiber and highly versatile.

On the other hand, with the recent increase in demand for Internet communication, optical fiber communication apparatuses have become faster. Optical semiconductor apparatuses also require a technique for housing an optical semiconductor chip and a multifunctional semiconductor component in a single package in order to prevent degradation in S/N ratio due to increased speed and provide a high-performance optical semiconductor device.

For instance, Patent Document 1 discloses an optical receiver with a photodiode and a preamplifier housed in a TO package. Patent Documents 2 and 3 disclose a technique for housing a plurality of semiconductor components in a single package using an insulative flexible substrate.

However, the conventional technique disclosed in the above Patent Documents 2 and 3 is a technique applied to a large package, which is distinct from the package used for optical semiconductor apparatuses, and the technique is different from this invention in objects and problems. In the following, the problems to be solved by the invention are described with reference to the drawings.

FIG. 1 is a schematic view illustrating the connection of an optical semiconductor apparatus 1 based on a TO package to an optical fiber 40. The TO package is composed of a base 3 and a cap 2. The cap 2 is provided with a lens 5 for optical transmission/reception to/from the optical fiber 40. An optical semiconductor chip is placed inside the TO package and electrically connected to a lead 4 inserted through the base 3 from outside to inside.

FIG. 2 is a schematic view showing the A-A cross section (see FIG. 1) of an optical semiconductor apparatus for receiving an optical signal and converting it into an electrical signal. A photodiode 6 bonded onto a submount 7 is placed on a component placement surface 3b of the inside of the base 3. A metal interconnect is provided on the surface of the submount 7 and electrically connected to the photodiode 6. Furthermore, a semiconductor component 8, such as a preamplifier and TIA (transimpedance amplifier), and a passive component 9, such as a capacitor and resistor, are placed on the component placement surface 3b.

The photodiode 6 bonded onto the submount 7 is connected to the lead 4 by a metal wire 10 through the semiconductor component 8 or the passive component 9. Light injected from the optical fiber 40 into the photodiode 6 is converted into an electrical signal by the photodiode 6, amplified by the semiconductor component 8, and externally extracted by the lead 4. The lead 4 is inserted into an opening 4b provided through the base 3 from outside to the component placement surface 3b. The lead 4 is insulated from the base 3 by an insulative glass sintered body 12.

FIG. 3 is a schematic view showing the component layout of the TO package shown in FIG. 1. Five leads 4, including the leads not shown in FIGS. 1 and 2, are placed in the component placement surface 3b of the base 3. Five openings 4b provided in the base 3 are each sealed with the lead 4 and the glass sintered body 12 surrounding the lead 4. Furthermore, the submount 7 with the photodiode 6 bonded thereto, the semiconductor component 8, and the passive component 9 are placed and connected by metal wires 10.

In order to allow the above optical semiconductor apparatus to receive a fast optical signal, it is useful to replace the semiconductor component 8 by a multifunctional semiconductor component to eliminate loss due to transmission of electrical signals between a plurality of functional devices. When a multifunctional semiconductor component is housed in a TO package, it is necessary to place a semiconductor component having a large chip size due to its multifunctionality, and a newly required passive component. Thus, one problem is to obtain space for placing these components in the limited space of the component placement surface 3b of the base 3.

In a small TO package, the area of the openings 4b sealed with the glass sintered body 12 accounts for a large proportion of the component placement surface 3b. On the other hand, no component can be placed on the glass sintered body 12. Hence, the effective space for placing components is limited. Furthermore, if the number of leads 4 is increased to provide new input terminals in order to house a multifunctional semiconductor component, the space is further decreased.

Furthermore, increase in the number of housed components complicates interconnection by metal wires. Thus, component layout without intersection between metal wires is difficult, which is another problem.

Patent Document 1: US 2004/0264980 A1
Patent Document 2: JP-A-9-232500
Patent Document 3: JP-A-10-4510

SUMMARY OF THE INVENTION

According to an aspect of the present invention, an optical semiconductor apparatus composed of a cap and a base including; a metal package including a plurality of openings penetrating through the base from outside to inside, a lead with its end portion protruding to the inside of the base and an insulator covering a side surface of the lead being inserted into each of the openings, and the lead being insulated from the base; an insulating film with its backside bonded to the inside of the base, the insulating film having a metal pattern formed on its frontside; and a semiconductor component placed on the base or on the insulating film, the insulating film covering the opening up to vicinity of the side surface of the lead.

According to other aspect of the present invention, the optical semiconductor apparatus includes the metal pattern formed on the insulating film interconnecting between the semiconductor component and the lead, where the semiconductor component or the lead is connected to the metal pattern by a metal wire and impedance matching is achieved at the junction between the metal pattern and the metal wire.

According to other aspect of the present invention, the optical semiconductor apparatus includes the insulating film including a backside metal pattern formed entirely or partly on the backside bonded to the inside of the base and at least one or more through holes electrically connecting between the backside metal pattern and the metal pattern formed on the frontside.

According to other aspect of the present invention, the optical semiconductor apparatus includes the insulating film being a multilayer insulating film with a plurality of insulating films laminated therein, and containing an interlayer interconnect inserted between the insulating films and a through hole electrically connecting between the metal pattern provided on the frontside or backside of the multilayer insulating film and the interlayer interconnect.

DETAILED DESCRIPTION OF THE INVENTION

Embodiments according to the invention will now be described in detail with reference to the accompanying drawings.

Figure 1:
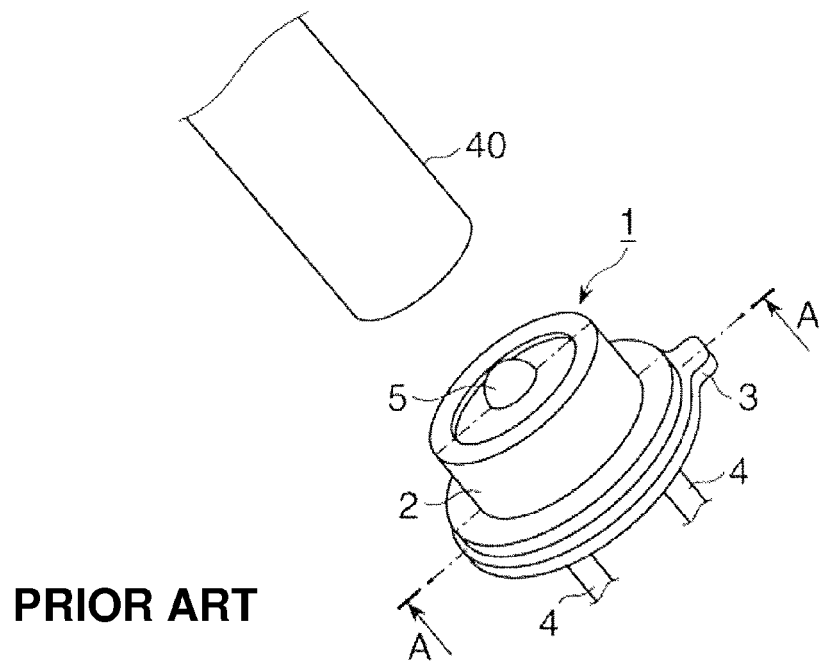
FIG. 1 is a schematic view illustrating the connection of an optical semiconductor apparatus to an optical fiber.
Figure 2:
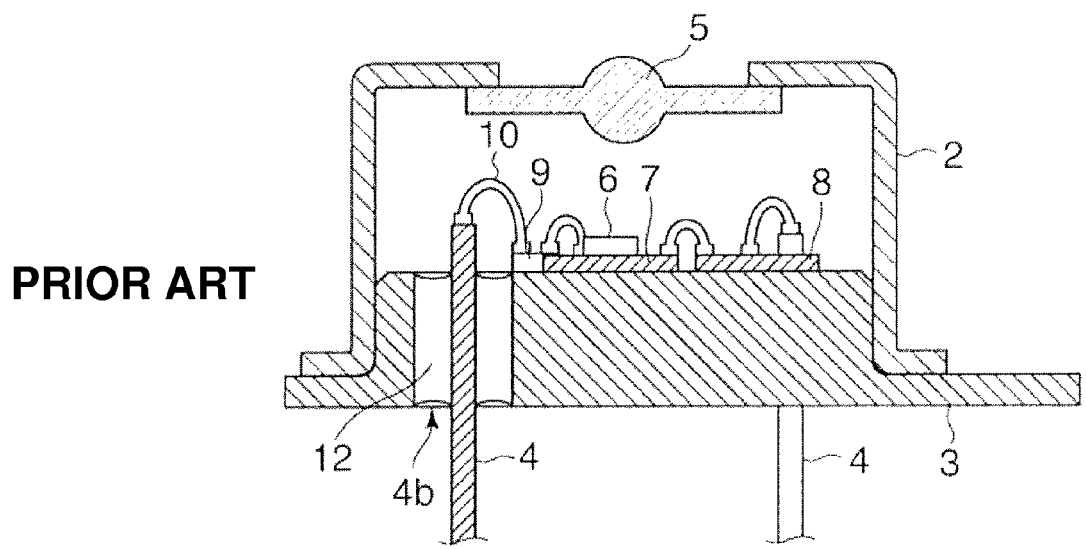
FIG. 2 is a schematic view showing the A-A cross section of an optical semiconductor apparatus according to a conventional technique.
Figure 3:
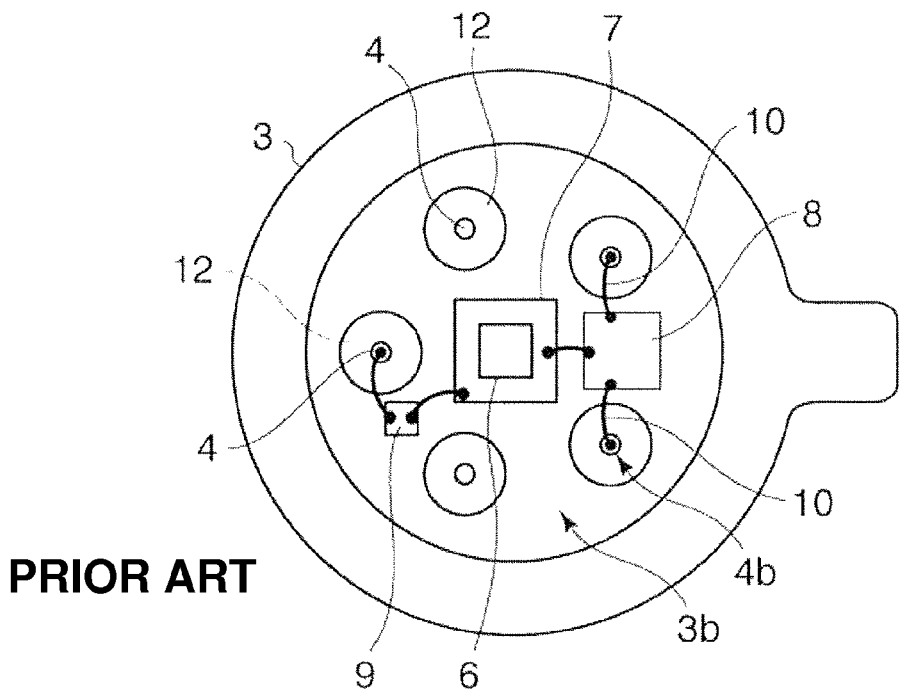
FIG. 3 is a schematic view showing the component layout of the optical semiconductor apparatus according to the conventional technique.
Figure 4:
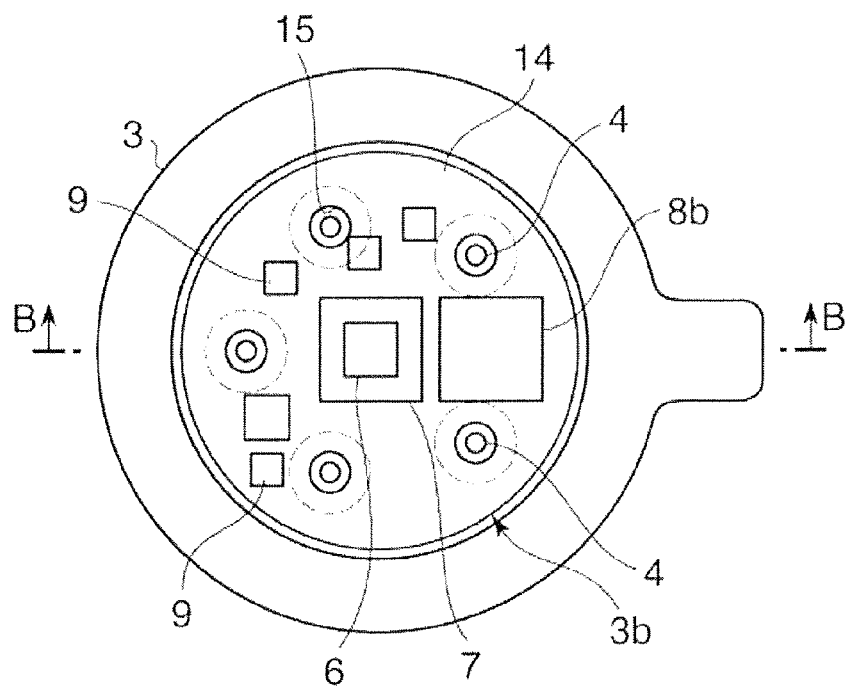
FIG. 4 is a schematic view showing the component layout of an optical semiconductor apparatus according to the invention.

FIG. 4 is a schematic view showing the component layout on the inside of the base 3 in an optical semiconductor apparatus of the invention. In this invention, the component placement surface 3b of the base 3 is entirely covered with an insulating film 14. The insulating film 14 covers up to the vicinity of the leads 4 and overlies most of the glass sintered body 12. The insulating film 14 can be bonded to the base 3 by using a resin-based adhesive, or can be bonded with conductive paste. Furthermore, as described later, a metal pattern can be formed on the backside, or the bonding surface, of the insulating film 14, and bonded with solder.

As shown, a photodiode 6 bonded onto a submount 7, a semiconductor component 8b having TIA and LIA (limiting amplifier) functionality, and passive components 9 are placed on the insulating film 14. Although the submount 7 with the photodiode 6 bonded thereto is also a semiconductor component, it is separately described in the following.

In this invention, the insulating film 14 covers most of the area occupied by the openings 4b sealed with the glass sintered body 12. This expands the region capable of placing components and allows placement of the semiconductor component 8b having a large chip size due to its multifunctionality and a plurality of passive components 9.

Figure 5:
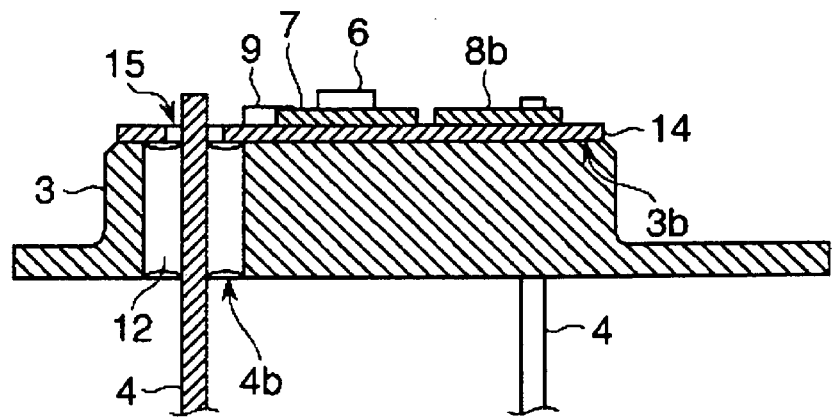
FIG. 5 is a schematic view showing the B-B cross section of the optical semiconductor apparatus according to the invention.

FIG. 5 schematically shows the B-B cross section of the base 3 shown in FIG. 4. The insulating film 14 is placed on the component placement surface 3b of the base 3. The lead 4 penetrates through an opening 15 provided in the insulating film 14 and projects its end portion to the frontside of the insulating film 14.

In this embodiment, the opening 15 has a diameter of approximately 0.4 mm, and the lead 4 has a diameter of approximately 0.2 mm. Hence, the gap formed between the lead 4 and the opening 15 is approximately 0.1 mm. On the other hand, the opening 4b provided in the base 3 has a diameter of approximately 1.0 mm. That is, the annular portion of the opening 4b having a width of 0.3 mm except the lead 4 having a diameter of 0.2 mm and a gap of 0.1 mm is covered with the insulating film 14.

Furthermore, as shown in FIG. 5, the semiconductor component 8b, the photodiode 6 bonded onto the submount 7, and the passive components 9 are placed on the insulating film 14.

Figure 6:
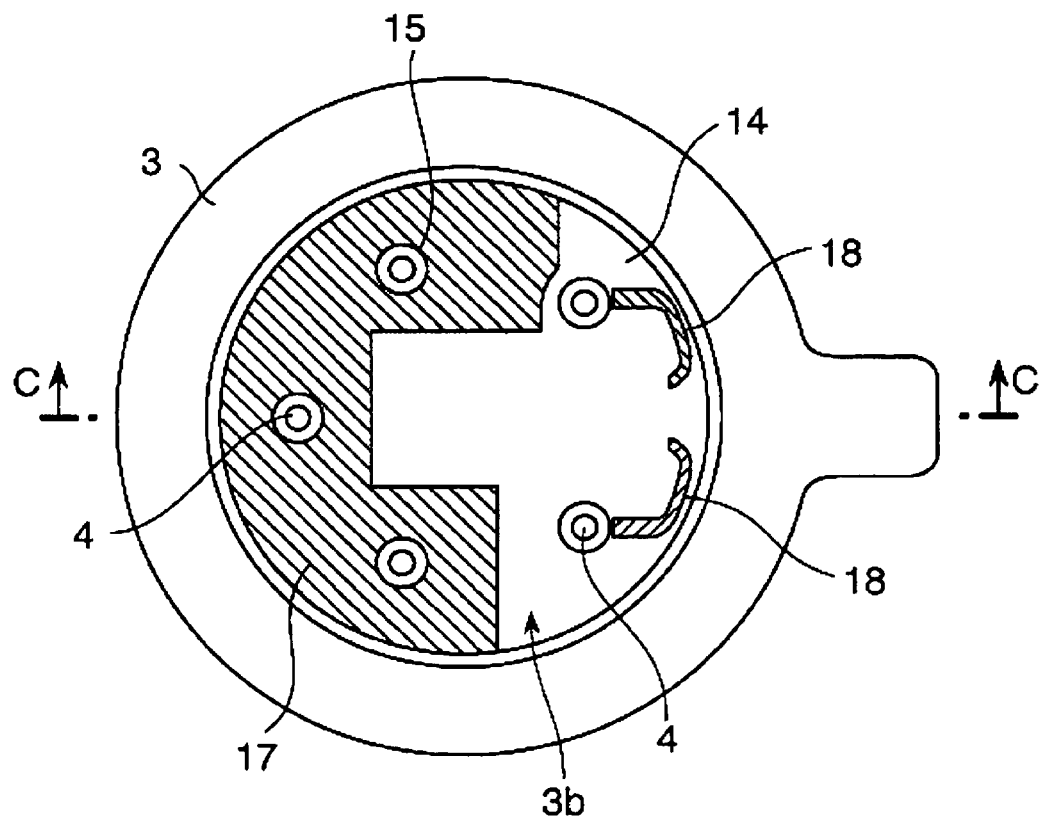
FIG. 6 is a schematic view showing the state in which an insulating film is bonded to a base of the optical semiconductor apparatus according to the invention.

FIG. 6 is a schematic view showing the state in which the insulating film 14 with metal patterns 17, 18 formed thereon is bonded to the component placement surface 3b of the base 3. The metal pattern 17 in the figure is a GND pattern and electrically connected to a backside metal pattern 22 and the base 3 through a through hole 21 described later. On the other hand, the metal pattern 18 is an interconnect pattern provided to interconnect between the lead 4 and the output terminal of the semiconductor component 8b.

Figure 7:
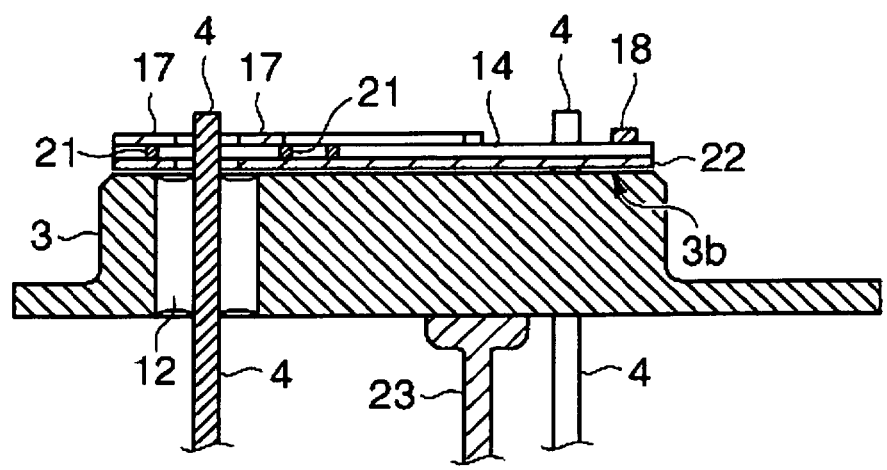
FIG. 7 is a schematic view showing the C-C cross section of the optical semiconductor apparatus according to the invention.

FIG. 7 is a schematic view showing the C-C cross section of the base 3 shown in FIG. 6. The insulating film 14 is bonded onto the component placement surface 3b of the base 3. A backside metal pattern 22 is formed entirely on the backside of the insulating film 14. The component placement surface 3b of the base 3 is bonded and electrically connected to the backside of the insulating film 14 with solder or conductive paste. A ground terminal 23 is attached to the outside of the base 3. When the optical semiconductor apparatus is in use, the base 3 and the backside metal pattern 22 are held at a ground potential.

The GND pattern 17 formed on the frontside of the insulating film 14 is electrically connected to the backside metal pattern 22 through a through hole 21. Hence, when the optical semiconductor apparatus is in use, the GND pattern 17 is placed at the ground potential. On the other hand, no through hole 21 is provided between the interconnect pattern 18 formed on the frontside of the insulating film 14 and the backside metal pattern 22. The interconnect pattern 18 is a microstrip line opposed to the backside metal pattern 22 across the insulating film 14.

The backside metal pattern 22 is formed throughout the backside of the insulating film 14, and thereby the backside is entirely held at the ground potential. Consequently, the floating capacitance of the microstrip line formed at the frontside of the insulating film 14 has a definite value determined by the thickness and dielectric constant of the insulating film 14. Thus, the electrical circuit formed on the frontside of the insulating film 14 has stable frequency characteristics, improving the performance of the optical semiconductor apparatus.

Figure 8:
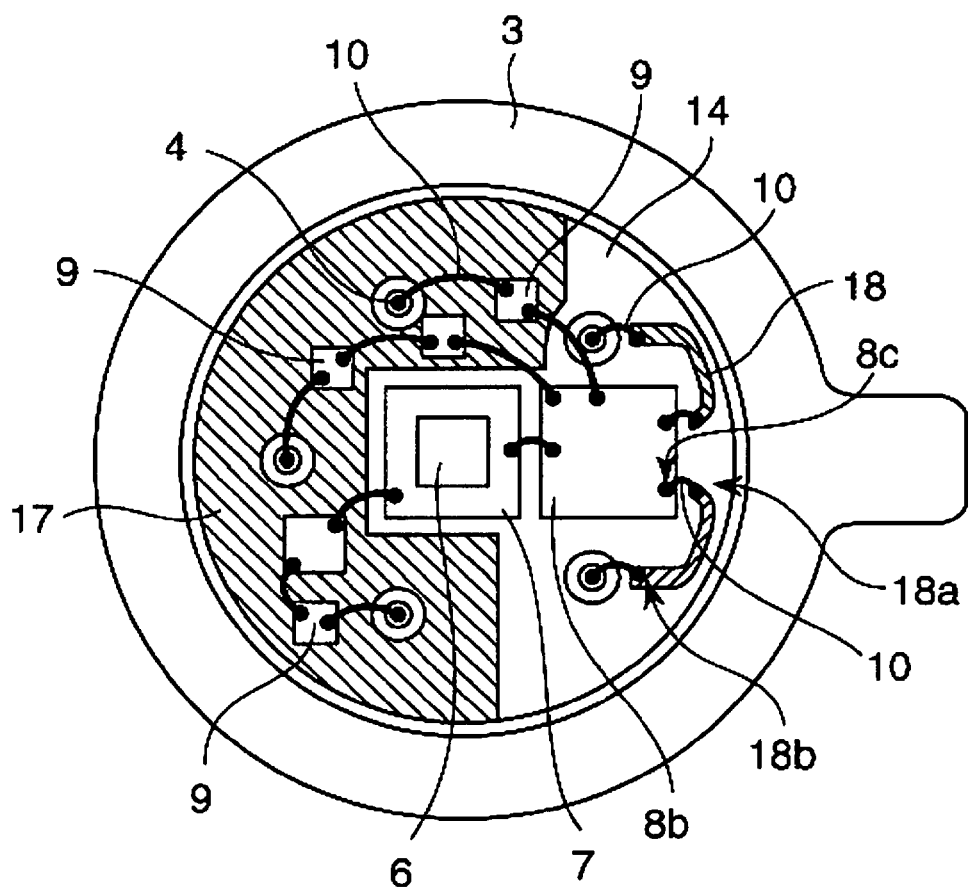
FIG. 8 is a schematic view showing the component layout of the optical semiconductor apparatus according to the invention.

FIG. 8 is a schematic view showing the state in which components are placed on the insulating film 14 shown in FIG. 6 and interconnected by metal wires 10. The photodiode 6 bonded onto the submount 7 and the semiconductor component 8b are placed. Furthermore, the passive components 9 are placed on the GND pattern 17 and connected to the lead 4, the submount 7, and the semiconductor component 8b by metal wires. These connections are interconnects for supplying a driving voltage from the lead 4 to the photodiode 6 and the semiconductor component 8b.

An optical signal injected from an optical fiber into the optical semiconductor apparatus is converted into an electrical signal in the photodiode 6. The submount 7 and the semiconductor component 8b are interconnected by a metal wire 10 for transferring the electrical signal converted in the photodiode 6 to the semiconductor component 8b. The signal output terminal 8c of the semiconductor component 8b and an end portion 18a of the interconnect pattern are also interconnected by a metal wire 10. The other end portion 18b of the interconnect pattern 18 is connected to the lead 4.

The electrical signal outputted from the output terminal 8c of the semiconductor component 8b is transmitted through the interconnect pattern 18 and externally outputted from the lead 4. Here, the interconnect pattern 18 can be impedance matched with the semiconductor component 8b and the lead 4 to reduce reflection of electrical signals. This serves to reduce the transfer loss of electrical signals and improve the performance of the optical semiconductor apparatus.

For instance, if the semiconductor component 8b is an amplifier having TIA and LIA functionality, the characteristic impedance at its output terminal 8c is designed to be 50Ω. Hence, impedance matching can be achieved by designing the shape of the interconnect pattern 18 so that its characteristic impedance as a strip line is 50Ω at the end portion 18a of the interconnect pattern. On the other hand, the lead 4 has an impedance of approximately 35Ω. Hence, the shape of the interconnect pattern 18 can be designed so that its characteristic impedance at the other endpoint 18b is 35Ω.

Figure 9:
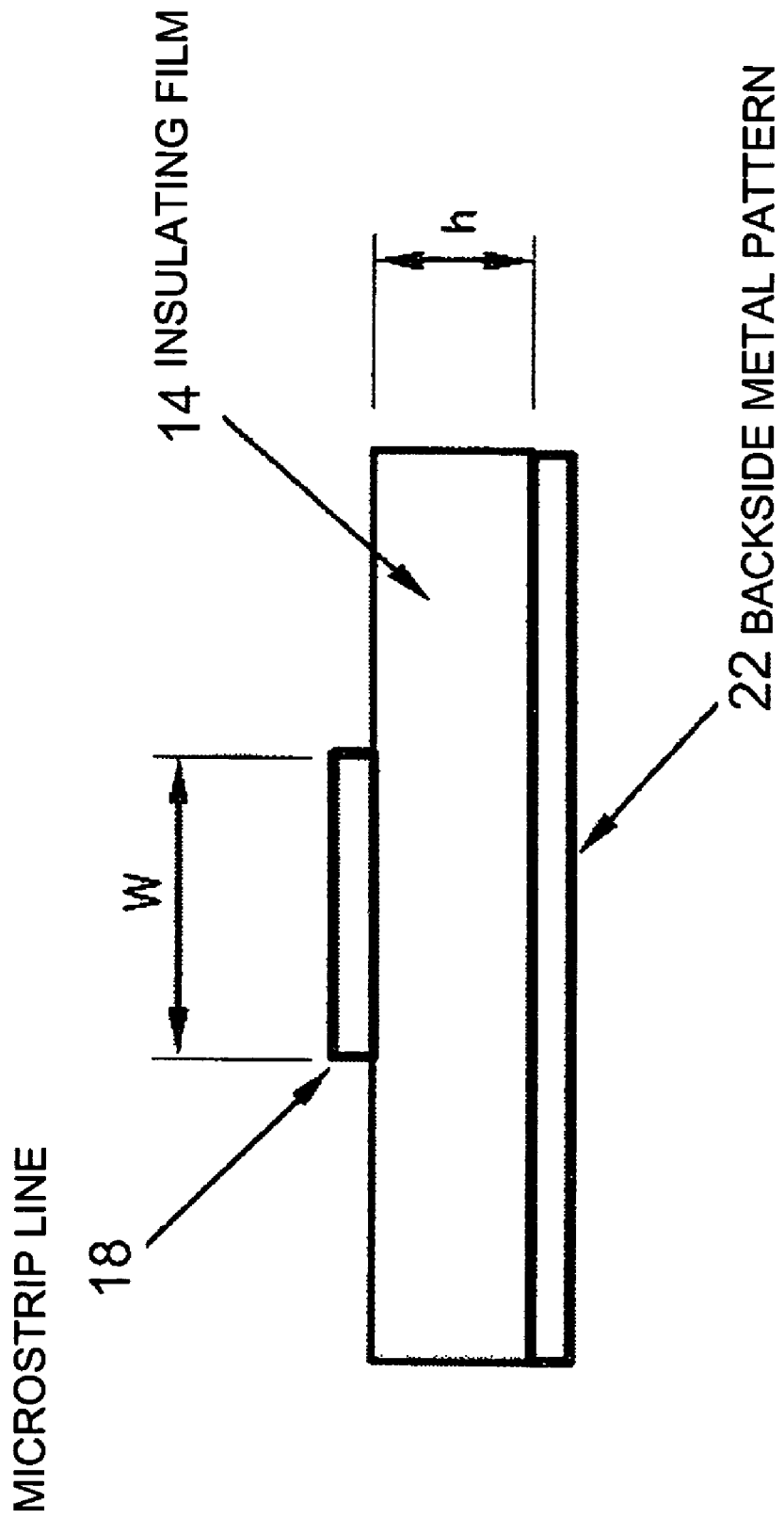
FIG. 9 is a schematic view showing a calculation model for impedance matching according to the invention.

FIG. 9 is a schematic view showing a model used in impedance calculation. An interconnect pattern (microstrip line) 18 with line width W is placed on the frontside of the insulating film 14, and a backside metal pattern 22 is provided entirely on the backside. The length of the microstrip line 18 is assumed infinite in the calculation.

TABLE 1 shows the result of simulation based on the model shown in FIG. 9. The thickness of the insulating film 14 is 50 μm, and its dielectric constant is 3.2, that of polyimide film. The line width W of the microstrip line 18 giving a characteristic impedance Z (Ω) of 35Ω and 50Ω is 0.18 mm and 0.1 mm, respectively. This result shows that impedance matching can be achieved if the width of the interconnect pattern 18 on the lead 4 side is 0.18 mm and the width of the interconnect pattern 18 on the semiconductor component 8b (amplifier) side is 0.1 mm.

TABLE 1

|  | Z (Ω) | Er | h (mm) | W (mm) |
| --- | --- | --- | --- | --- |
| Lead side | 35 | 3.2 | 0.05 | 0.18 |
| Amp side | 50 | 3.2 | 0.05 | 0.10 |

The above impedance matching is implemented in both the two interconnect patterns 18 shown in FIG. 8.

In the component layout shown in FIG. 8, it is necessary to shorten the metal wires 10 constituting the interconnect between the submount 7 and the semiconductor component 8b, the interconnect between the semiconductor component 8b and the interconnect pattern 18, and the interconnect between the interconnect pattern 18 and the lead 4, where electrical signals are transferred. As the metal wire 10 becomes longer, its characteristic impedance increases, and the transfer loss of electrical signals increases. Furthermore, the metal wires connecting between the components have various loop configurations and increase variation in characteristic impedance. This causes the problem of unstable performance of the optical semiconductor apparatus in the high-frequency band.

According to the invention, the high degree of freedom in component layout allows the submount 7 and the semiconductor component 8b to be placed always close to each other, and the aforementioned problems can be avoided. Furthermore, because the interconnect pattern 18 is interposed, a short metal wire can be used to connect between the end portion 18a of the interconnect pattern 18 and the semiconductor component 8b and between the other end portion 18b of the interconnect pattern 18 and the lead 4.

In the conventional technique where the output terminal 8c of the semiconductor component 8b is directly connected to the lead 4 by a metal wire 10, the output terminal of the semiconductor component 8b needs to be placed close to the lead 4 in order to shorten the metal wire 10. This requires expensive dedicated components designed in consideration of the layout of the lead 4 and the layout of the semiconductor component 8b. In contrast, in this invention, the interconnect pattern 18 can be adapted to the semiconductor component 8b to avoid the problems, allowing use of general-purpose components.

Figure 10:
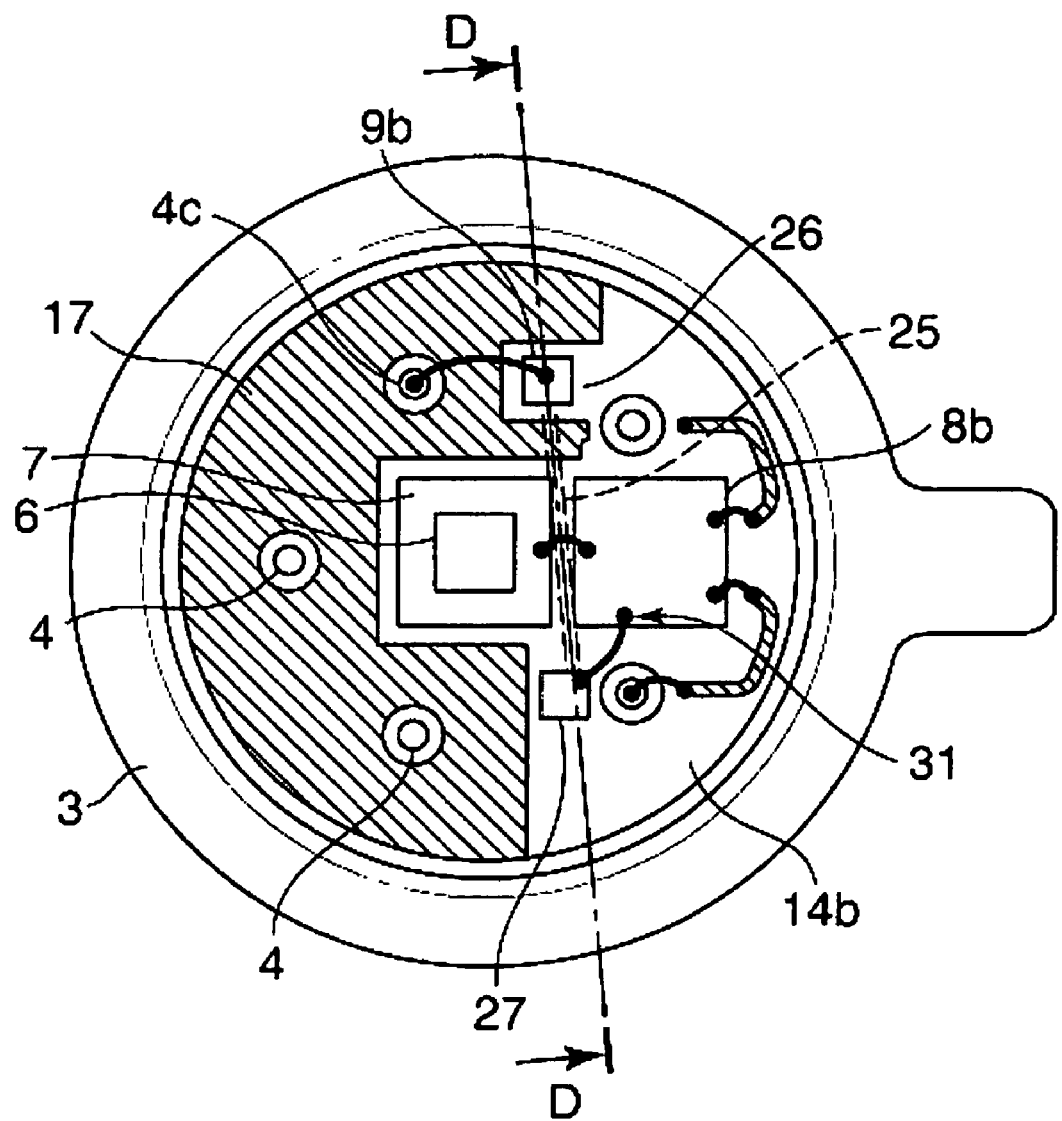
FIG. 10 is a schematic view showing an alternative embodiment according to the invention.

FIG. 10 is a schematic view showing an alternative embodiment of the invention. The description is omitted on elements labeled in the figure which are common to those in FIG. 8 described above. Furthermore, illustration of passive components 9 to be placed on the GND pattern 17 is also omitted.

In this embodiment, the insulating film 14 bonded onto the component placement surface 3b of the base 3 is a multilayer film with two insulating films 14a, 14b laminated therein. An interlayer interconnect 25 is provided at the interface between the insulating films 14a and 14b. The interlayer interconnect 25 connecting between metal patterns 26 and 27 formed on the frontside of the insulating film 14b is shown by a dashed line in the figure.

The semiconductor component 8b of this embodiment is a general-purpose component, and the voltage supply terminal is located at a position denoted by 31 in the figure. On the other hand, the driving voltage is supplied from the lead 4c shown in the figure. In such a case, no appropriate interconnect pattern can be formed on the frontside of the insulating film 14b because it is obstructed by the submount 7 or the semiconductor component 8b. Connection using a metal wire is also obstructed by the submount 7 or the semiconductor component 8b. This problem can be solved by interconnection using an interlayer interconnect 25 provided in the multilayer film.

Figure 11:
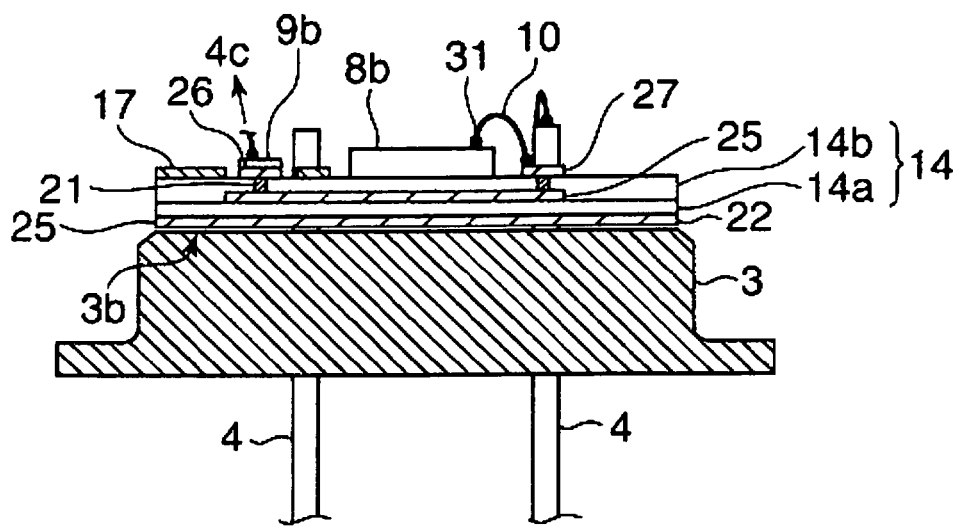
FIG. 11 is a schematic view showing the D-D cross section of the optical semiconductor apparatus according to the invention.

FIG. 11 is a schematic view showing the D-D cross section of the base 3 in the embodiment shown in FIG. 10. The multilayer film 14 with the insulating films 14a, 14b laminated therein is placed on the component placement surface 3b of the base 3. A backside metal pattern 22 is provided on the backside of the multilayer film 14 and bonded to the base 3 using solder or conductive paste. Furthermore, the interlayer interconnect 25 is provided at the interface between the insulating films 14a and 14b and electrically connected to the metal patterns 26 and 27 formed on the frontside of the insulating film 14b through a through hole 21.

Furthermore, a passive component 9 is placed on the metal pattern 26. (The passive component 9 in this case is a resistor.) The passive component 9 is connected to the lead 4c by a metal wire 10. On the other hand, the metal pattern 27 is connected to the voltage supply terminal 31 of the semiconductor component 8b by a metal wire 10. This allows the lead 4c to be connected to the voltage supply terminal 31 of the semiconductor component 8b irrespective of the layout of the submount 7 or the semiconductor component 8b.

FIGS. 12 to 15 are schematic views showing insulating films 14 used in alternative embodiments of the invention. The description is omitted on elements labeled in the figure which are common to those in the above embodiments.

Figure 12:
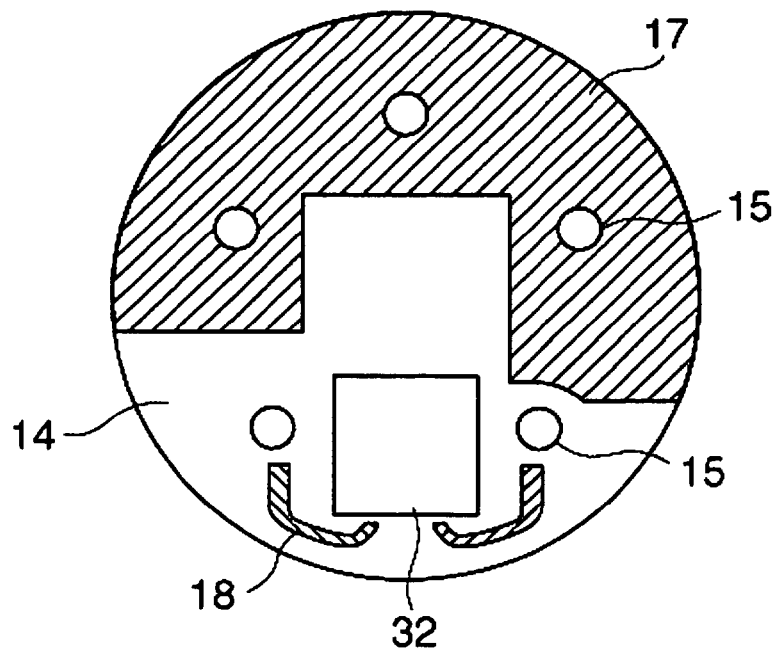
FIGS. 12 to 16 are schematic views showing insulating films used in alternative embodiments according to the invention.

In FIG. 12, the insulating film 14 shown in FIG. 6 further includes an opening 32 in a portion where the semiconductor component 8b is to be placed. The opening 32 is slightly larger than the outline of the semiconductor component 8b, and is provided to directly bond the semiconductor component 8b to the component placement surface 3b of the base 3. Such an insulating film 14 is used in the case where the backside of the semiconductor component 8b needs to be placed at the ground potential and, furthermore, the performance of the semiconductor component 8b is susceptible to variation in the ground potential.

Figure 13:
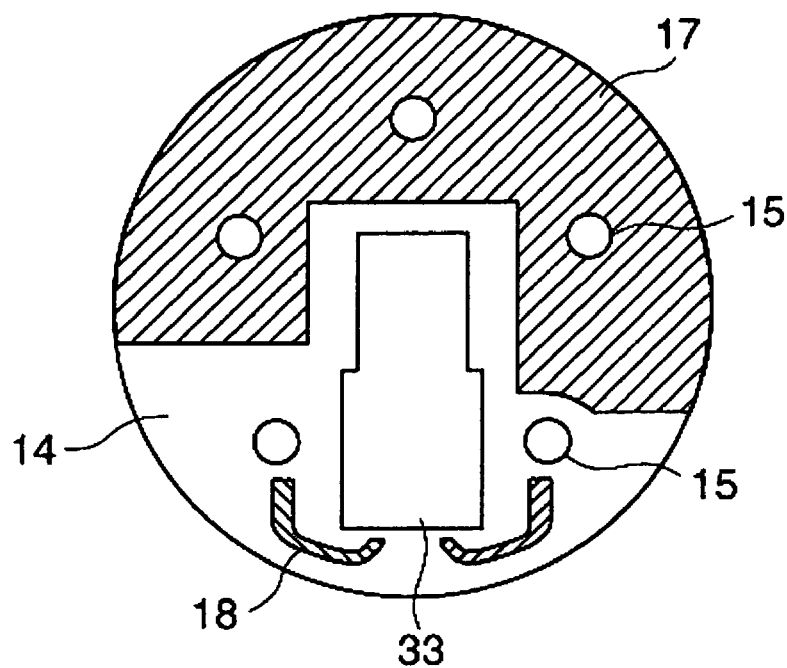

FIG. 13 is a schematic view of an insulating film 14 including an opening 33 so that both the submount 7 with the photodiode 6 bonded thereto and the semiconductor component 8b are bonded to the component placement surface 3b of the base 3. In the case where the performance of the optical semiconductor apparatus may be varied due to the potential difference occurring between the ground potential to which the terminal of the photodiode 6 is connected and the ground potential of the backside of the semiconductor component 8b, the insulating film 14 shown in FIG. 13 is used in order to hold the terminal of the photodiode 6 and the backside of the semiconductor component 8b at the same ground potential.

Figure 14:
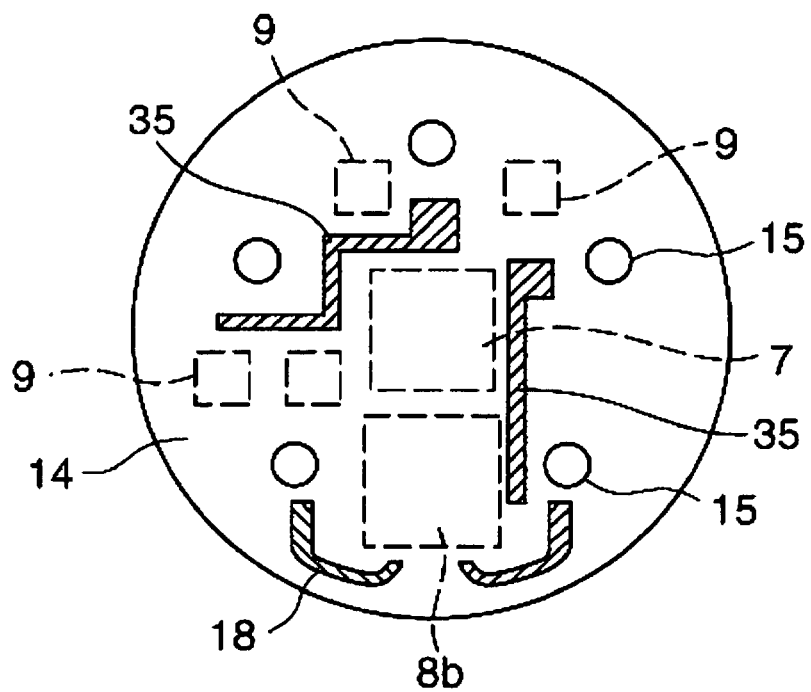

FIG. 14 is a schematic view showing an insulating film 14 in which interconnect patterns 18 and 35 are provided on the frontside of the insulating film 14. It is used in order to interconnect between a plurality of components using the interconnect pattern 35. This is useful in the case where the interconnect length of the metal wire is increased because the passive components 9 are distanced from the semiconductor component, and in the case where the number of components are increased, as shown by dashed lines in the figure.

Figure 15:
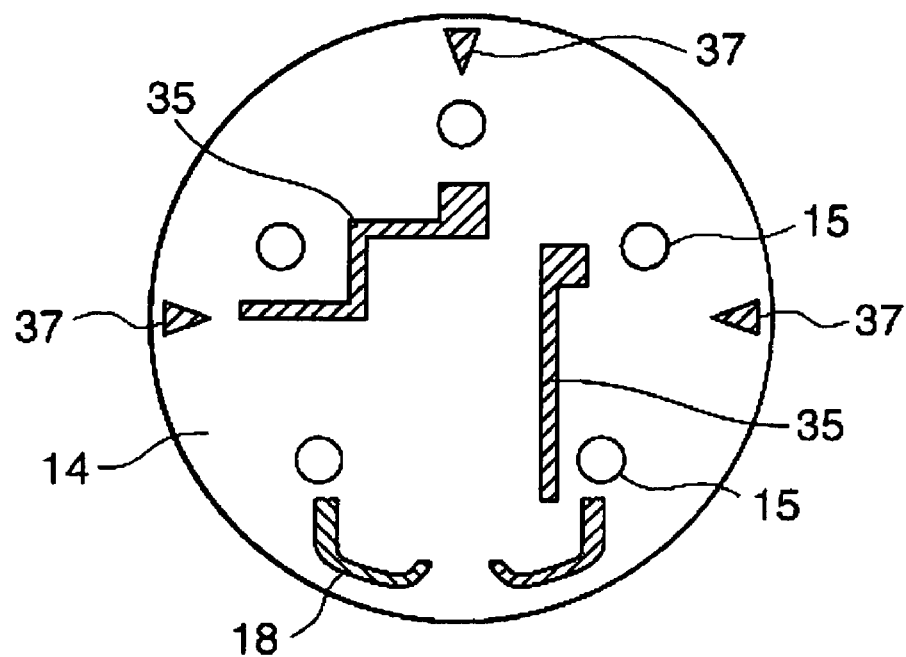

FIG. 15 is a schematic view showing an insulating film 14 including an alignment mark 37. The alignment mark 37 placed therein serves as the target for alignment when an automated machine is used to perform placement of components and bonding of metal wires.

Figure 16:
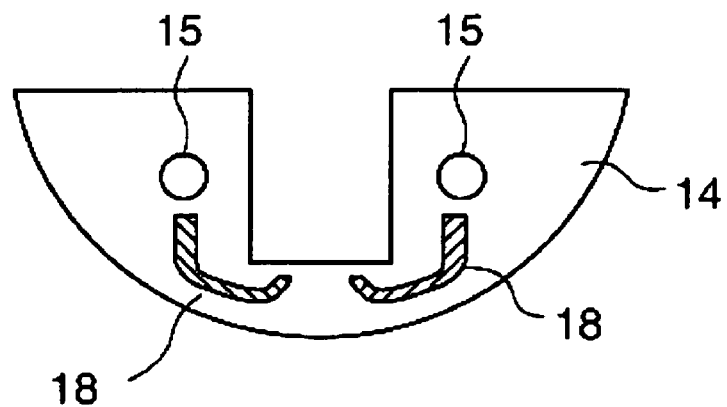

FIG. 16 shows an insulating film 14 according to an embodiment of using only the interconnect pattern 18 for interconnecting between the semiconductor component 8b and the lead 4. It can be conveniently used in the case where a short metal wire 10 is used to interconnect the semiconductor component 8b and the lead 4 to the interconnect pattern 18 and a desired performance is obtained by impedance matching of the semiconductor component 8b and the lead 4 with the interconnect pattern 18.

The material of the insulating film 14 according to the invention can be polyimide film, LCP (liquid crystal polymer) film and the like. The LCP film has low dielectric loss for high-frequency signals, and hence is favorable to electrical signals in the high-frequency band. However, it is inferior in heat resistance, and hence has the problem of limitations on available solders.

The insulating film 14 can be manufactured by the following method. Through holes 21 are formed by a microdrill in a polyimide or other insulating film with copper foils laminated on both sides. TH (through hole) plating based on copper plating is performed thereon to electrically connect between the front and back copper foil. Next, patterns are formed by photolithography and etching. Furthermore, openings 15 for inserting leads 4 are processed by the microdrill. Finally, the contour is punched out.

The metal wire described in the above embodiments is illustratively a gold wire. Although the embodiments have been described with reference to an optical semiconductor apparatus including a photodiode and a semiconductor component (amplifier), the invention can also be practiced in an optical semiconductor apparatus in which a surface emitting laser or light emitting diode is combined with a driver IC.

The embodiments of the invention have been described in detail. However, the optical semiconductor apparatus according to the invention is not limited to the above embodiments, but can be variously modified and altered within the scope of the invention described in the claims.

The invention claimed is:

1. An optical semiconductor apparatus composed of a cap and a base, comprising:
    a metal package including a plurality of openings penetrating through the base from outside to inside, a lead with its end portion protruding to the inside of the base and an insulator covering a side surface of the lead being inserted into each of the openings, and the lead being insulated from the base;
    an insulating film with its backside bonded to the inside of the base, the insulating film having a metal pattern formed on its frontside; and
    a semiconductor component placed on the base or on the insulating film,
    the insulating film covering the opening up to a vicinity of the side surface of the lead.

2. The apparatus according to claim 1, wherein
    the metal pattern formed on the insulating film is a pattern interconnecting between the semiconductor component and the lead,
    the semiconductor component or the lead is connected to the metal pattern by a metal wire, and
    impedance matching is achieved at the junction between the metal pattern and the metal wire.

3. The apparatus according to claim 1, wherein the insulating film includes:
    a backside metal pattern formed entirely or partly on the backside bonded to the inside of the base; and
    at least one or more through holes electrically connecting between the backside metal pattern and the metal pattern formed on the frontside.

4. The apparatus according to claim 1, wherein the insulating film is a multilayer insulating film with a plurality of insulating films laminated therein, and includes:
    an interlayer interconnect inserted between the insulating films; and a through hole electrically connecting between the metal pattern provided on the frontside or backside of the multilayer insulating film and the interlayer interconnect.

5. An optical semiconductor apparatus composed of a cap and a base, comprising:
   a metal package including a plurality of openings penetrating through the base from outside to inside, a lead with its end portion protruding to the inside of the base and an insulator covering a side surface of the lead being inserted into each of the openings, and the lead being insulated from the base;
   an insulating film with its backside bonded to the inside of the base, the insulating film having a metal pattern formed on its frontside; and
   a semiconductor component placed on the base or on the insulating film,
   the insulating film covering the opening up to a vicinity of the side surface of the lead,
   the metal pattern formed on the insulating film being a pattern interconnecting between the semiconductor component and the lead,
   the semiconductor component or the lead being connected to the metal pattern by a metal wire, and
   impedance matching being achieved at the junction between the metal pattern and the metal wire.

6. The apparatus according to claim 5, wherein the insulating film includes:
   a backside metal pattern formed entirely or partly on the backside bonded to the inside of the base; and
   at least one or more through holes electrically connecting between the backside metal pattern and the metal pattern formed on the frontside.

7. The apparatus according to claim 5, wherein the insulating film is a multilayer insulating film with a plurality of insulating films laminated therein, and includes:
   an interlayer interconnect inserted between the insulating films; and
   a through hole electrically connecting between the metal pattern provided on the frontside or backside of the multilayer insulating film and the interlayer interconnect.

8. An optical semiconductor apparatus composed of a cap and a base, comprising:
   a metal package including a plurality of openings penetrating through the base from outside to inside, a lead with its end portion protruding to the inside of the base and an insulator covering a side surface of the lead being inserted into each of the openings, and the lead being insulated from the base;
   an insulating film with its backside bonded to the inside of the base, the insulating film having a metal pattern formed on its frontside; and
   a semiconductor component placed on the base or on the insulating film,
   the insulating film covering the opening up to a vicinity of the side surface of the lead,
   the metal pattern formed on the insulating film being a pattern interconnecting between the semiconductor component and the lead,
   the semiconductor component or the lead being connected to the metal pattern by a metal wire,
   impedance matching being achieved at the junction between the metal pattern and the metal wire, and
   the insulating film including:
   a backside metal pattern formed entirely or partly on the backside bonded to the inside of the base; and
   at least one or more through holes electrically connecting between the backside metal pattern and the metal pattern formed on the frontside.

9. The apparatus according to claim 8, wherein the insulating film is a multilayer insulating film with a plurality of insulating films laminated therein, and includes:
   an interlayer interconnect inserted between the insulating films; and
   a through hole electrically connecting between the metal pattern provided on the frontside or backside of the multilayer insulating film and the interlayer interconnect.

* * * * *